United States Patent
Rathore et al.

[11] Patent Number: 5,982,054
[45] Date of Patent: *Nov. 9, 1999

[54] MAGNETOSTRICTIVE DEVICE

[75] Inventors: Amer Rathore; Teruo Mori; Kiyoshi Uchida, all of Tokyo; Hiroshi Eda; Yoshio Yamamoto, both of Ibaraki-ken, all of Japan

[73] Assignee: TDK Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/719,643

[22] Filed: Sep. 25, 1996

[30] Foreign Application Priority Data

Sep. 26, 1995 [JP] Japan .................................. 7-248081
May 24, 1996 [JP] Japan .................................. 8-130397

[51] Int. Cl.$^6$ .......................... H04R 15/00; H01L 41/06
[52] U.S. Cl. ............................................. 310/26; 381/190
[58] Field of Search ..................... 310/16, 26; 335/215; 367/156, 168; 381/190

[56] References Cited

U.S. PATENT DOCUMENTS

| | | | |
|---|---|---|---|
| 2,064,911 | 12/1936 | Hayes | 310/26 |
| 2,776,416 | 1/1957 | Harris | 310/26 |
| 2,776,417 | 1/1957 | Harris | 310/26 |
| 4,642,802 | 2/1987 | Pozzo et al. | 367/168 |
| 5,184,037 | 2/1993 | Kobayashi et al. | 310/26 |
| 5,357,232 | 10/1994 | Suzuki et al. | 335/215 |
| 5,437,197 | 8/1995 | Uras et al. | 73/862.69 |
| 5,602,434 | 2/1997 | Riedl | 310/26 |
| 5,747,915 | 5/1998 | Benavides | 310/331 |

FOREIGN PATENT DOCUMENTS

| | | | |
|---|---|---|---|
| 0 443 873 A1 | 8/1991 | European Pat. Off. | 310/26 |
| 2-237477 | 9/1990 | Japan | 310/26 |
| 2-288278 | 11/1990 | Japan | 310/26 |
| 3-183370 | 8/1991 | Japan | 310/26 |

OTHER PUBLICATIONS

Teruo Mori, et al., "Magnetostrictive Vibration Sensor", pp. 1–4.

*Primary Examiner*—Thomas M. Dougherty
*Attorney, Agent, or Firm*—Oblon, Spivak, McClelland, Maier & Neustadt, P.C.

[57] ABSTRACT

To provide a multi-purpose type magnetostrictive device that may be used as an acceleration sensor or a vibration sensor capable of detecting forces acting in more than one direction and which may also be employed as a torque sensor, an actuator, a motor and the like.

Coils 110 to 310 of magnetostrictive bodies 10 to 30 are wound around magnetostrictive members 120 to 320 in such a manner that voltages corresponding to enlongation/contraction of the magnetostrictive members 120 to 320 are generated. The magnetostrictive members 120 to 320 are each constrained at the two ends. The magnetic circuits 130 to 330 apply a bias magnetic field to the magnetostrictive members 120 to 320. The magnetostrictive bodies 10 to 30 are positioned so that they are all aligned in the direction of the Z axis which is taken in the direction of the two ends of each of the magnetostrictive members 120 to 320 and they are also arranged in such a manner that a relationship is maintained in which, on the flat plane formed by the X axis and the Y axis running at a right angle to the direction of the Z axis, a polygonal flat plane S is constituted by connecting the points P1 to P3 at which the magnetostrictive bodies 10 to 30 are positioned, the number of sides of which corresponds to the number of bodies.

22 Claims, 8 Drawing Sheets waveform (a) of magnetostrictive body 10 waveform (b) of magnetostrictive body 20 waveform (c) of magnetostrictive body 30 waveform (d) of vibration in direction Z waveform (a) of magnetostrictive body 10 waveform (b) of magnetostrictive body 20 waveform (c) of magnetostrictive body 30 waveform (d) of vibration in direction X waveform (a) of magnetostrictive body 10 waveform (b) of magnetostrictive body 20 waveform (c) of magnetostrictive body 30 waveform (d) of vibration in direction Y

MAGNETOSTRICTIVE DEVICE

BACKGROUND OF THE INVENTION

1. Field of the Invention

The present invention relates to a magnetostrictive device which employs magnetostrictive bodies. The magnetostrictive device according to the present invention may be employed as a vibration sensor, an acceleration sensor, an actuator, a motor, a torque sensor or the like. Specific examples of application as an acceleration sensor include an automotive engine knock sensor and an automotive safety system acceleration sensor, whereas specific examples of application as a vibration sensor include an error state detection sensor in a rotary machine and the like.

2. Discussion of Background

Well known acceleration sensors, vibration sensors, torque sensors and the like in the prior art employ piezoelectric elements. A sensor that employs piezoelectric elements takes advantage of the phenomenon in which, when an external force caused by vibration or the like is applied to a piezoelectric element, an electric charge signal corresponding to the external force is generated from the piezoelectric element.

However, since a piezoelectric element has a high internal impedance, the electric charge signal is extremely sensitive to outside influences and tends to pick up noise. Consequently, in order to perform measurement with a high degree of precision, it is necessary to convert the electric charge signal to a voltage signal with a low impedance before the electric charge signal is input to a measuring device. This poses a problem in that an electronic circuit for impedance conversion and a power source are required, making the apparatus large and bulk.

Furthermore, when the ambient temperature exceeds approximately 120° C., polarization degradation occurs in a piezoelectric element, which, in turn, degrades the piezoelectric characteristics and reduces the product life. In addition, degradation of the piezoelectric characteristics also occurs when high static electricity is accumulated in the piezoelectric element. Moreover, there is an added problem in that a piezoelectric element does not have a high degree of mechanical strength.

With a sensor employing a magnetostrictive body, such problems occurring in a sensor employing a piezoelectric element can be solved. In a sensor employing a magnetostrictive body, since, when an external force is applied to the magnetostrictive body, a voltage signal is generated in the coil which surrounds the magnetostrictive body, it is not necessary to use an impedance conversion circuit. In addition, it operates in a stable manner at high temperatures, and degradation of the characteristics due to high voltages such as static electricity does not occur.

The literature on the prior technology of vibration sensors employing a magnetostrictive body include U.S. Pat. No. 4,161,665. In U.S. Pat. No. 4,161,665, a vibration sensor used for the detection of engine knock is disclosed. This vibration sensor features a structure in which a cylindrical Fe—Ni magnetostrictive member with a coil wound around it is provided together with a magnetic circuit constituted with a yoke and a magnet, within a housing. The magnetic circuit applies a bias magnetic field to the magnetostrictive member. A blade spring is provided between the housing and the magnetostrictive member so that a pre-stress can be applied to the magnetostrictive member with this blade spring. When vibration is applied in the longitudinal direction relative to the magnetostrictive member, the magnetic permeability of the magnetostrictive member changes due to dimensional change in the magnetostrictive member in its longitudinal direction caused by the vibration. This, in turn, causes the magnetic flux which is interlinked with the coil to change, inducing a voltage in the coil.

However, U.S. Pat. No. 4,161,665 only discloses a sensor which detects vibration in one direction and does not disclose technology for detecting vibration in two or more directions.

SUMMARY OF THE INVENTION

It is an object of the present invention to provide a magnetostrictive device which is suitable for use as an acceleration sensor or a vibration sensor that is capable of performing detection of vibration in more than one direction.

It is a further object of the present invention to provide a magnetostrictive device that can be used as a torque sensor, an actuator, a motor or the like.

In order to achieve the objects described above, the sensor according to the present invention includes at least three magnetostrictive bodies.

Each of the magnetostrictive bodies includes at least one coil, one magnetostrictive member and a magnetic circuit. The coil is combined with the magnetostrictive member in such a manner that a voltage corresponding to the extension/contraction of the magnetostrictive member is generated. The magnetostrictive member is constrained at the two ends. The magnetic circuit applies a bias magnetic field to the magnetostrictive member.

The present invention is further characterized in that the magnetostrictive bodies are all positioned in such a manner that they are aligned in the direction of a Z axis, which is taken in the direction of the constrained ends of the magnetostrictive member and that, on a flat plane formed by an X axis and a Y axis running at a right angle to the direction of the Z axis and, by connecting the points at which the magnetostrictive bodies are positioned, a polygonal flat plane is obtained, the number of sides of which corresponds to the number of bodies.

As mentioned above, the coil is combined with the magnetostrictive member in such a manner that a voltage corresponding to the extension/contraction of the magnetostrictive member is generated. The magnetostrictive member is constrained at the two ends and the magnetic circuit applies a bias magnetic field to the magnetostrictive member. In this structure, when an external force caused by vibration, acceleration or torque is applied to the magnetostrictive member, the dimensions of the magnetostrictive member change, which, in turn, changes the magnetic permeability of the magnetostrictive member. As a result, the density of the magnetic flux of the magnetostrictive member changes. As the magnetic flux, which is inter-linked with the coil, changes a voltage is induced in the coil. The external force that has been applied can be detected based upon this induced voltage.

There are at least three magnetostrictive bodies, and they are all positioned in such a manner that they are aligned in the direction of the Z axis which is taken in the direction of the two ends of the magnetostrictive members. Positioned in such a manner, each magnetostrictive body generates a relatively averaged detection output corresponding to an external force applied in the direction of the Z axis.

Furthermore, by connecting the points at which the magnetostrictive bodies are positioned on the flat plane formed by the X axis and the Y axis running at a right angle to the direction of the Z axis, a polygonal plane is constituted, the number of sides of which corresponds to the number of bodies. In this structure, when an external force is applied in the direction of the X axis and the Y axis, each magnetostrictive body is subjected to a different extension/contraction effect. Because of this, each magnetostrictive body generates a detection output, the detection voltage value or phase of which is different from that of the others. Consequently, based upon the detection outputs from the individual magnetostrictive bodies, an external force applied in the direction of the X axis and the Y axis can be detected.

In the flat plane formed by the X axis and the Y axis, when the direction of an external force changes, the extension/contraction effect changes in each of the magnetostrictive bodies in correspondence to the direction of the external force after the change. Thus, as long as an external force is applied in the direction running at a right angle to the Z axis, the external force can be detected regardless of the direction around Z axis in which it is applied.

When the present invention is adopted in a torque sensor, one end in the direction of the Z axis is mounted at a moving body whose torque is to be detected and the other end is fixed. With this, a detection signal corresponding to the rotational torque around the Z axis can be obtained from each of the magnetostrictive bodies.

When the present invention is adopted in an actuator, a motor or the like, the power that is supplied to each of the magnetostrictive bodies is controlled to ensure that the magnetostrictive bodies are caused to expand/contract in the direction of the Z axis sequentially. With this, a displacement that can be utilized in an actuator or a motor can be achieved at at least one end surface in the direction of the Z axis.

BRIEF DESCRIPTION OF THE DRAWINGS

Other objects, structures and advantages of the present invention are explained in further detail by referring to the attached drawings.

DETAILED DESCRIPTION OF THE PREFERRED EMBODIMENTS

Figure 1:
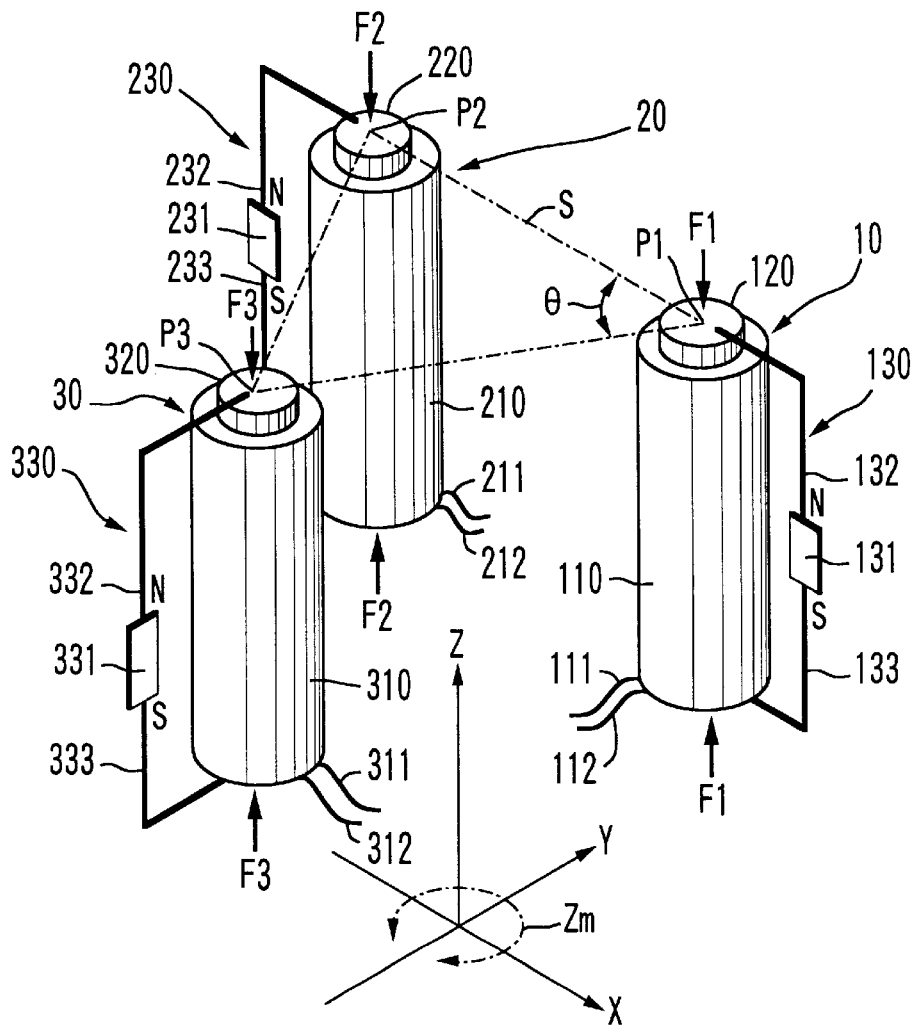
FIG. 1 is a perspective schematically showing the structure of the magnetostrictive device according to the present invention.

The sensor according to the present invention shown in FIG. 1 includes at least three magnetostrictive bodies 10, 20 and 30. The magnetostrictive body 10 includes at least one coil 110, a magnetostrictive member 120 and a magnetic circuit body 130. The coil 110 is combined with the magnetostrictive member 120 in such a manner that a voltage corresponding to the enlongation/contraction of the magnetostrictive member 120 is generated. The magnetostrictive member 120 is constrained at the two ends in the lengthwise direction. The magnetic circuit body 130 applies a bias magnetic field to the magnetostrictive member 120.

The magnetostrictive bodies 20 and 30 have an identical structure to that of the magnetostrictive body 10. In the magnetostrictive body 20, a coil 210 is combined with a magnetostrictive member 220 in such a manner that a voltage corresponding to the enlongation/contraction of the magnetostrictive member 220 is generated. The magnetostrictive member 220 is constrained at the two ends in the lengthwise direction. A magnetic circuit body 230 applies a bias magnetic field to the magnetostrictive member 220.

In the magnetostrictive body 30, a coil 310 is combined with a magnetostrictive member 320 in such a manner that a voltage corresponding to the enlongation/contraction of the magnetostrictive member 320 is generated. The magnetostrictive member 320 is constrained at the two ends in the lengthwise direction. A magnetic circuit body 330 applies a bias magnetic field to the magnetostrictive member 320.

In the structure described above, when an external force caused by vibration, acceleration or torque is applied to the magnetostrictive bodies 10 to 30, the dimensions of the magnetostrictive members 120 to 320 change, which, in turn, changes the magnetic permeability of the magnetostrictive members 120 to 320. Because of this, the density of the magnetic fluxes at the magnetostrictive members 120 to 320 changes and the magnetic fluxes, which are inter-linked with the coils 110 to 310, change to induce voltages at the coils 110 to 310. Based upon these induced voltages, the external force that has been applied can be detected.

The three magnetostrictive bodies 10 to 30 are all positioned in such a manner that they are aligned with the direction of the Z axis which is taken in the lengthwise direction of the magnetostrictive members 120 to 320. Positioned in this manner, each of the magnetostrictive bodies 10 to 30 generates a relatively averaged detection output corresponding to an external force applied in the direction of the Z axis.

Furthermore, the magnetostrictive bodies 10 to 30 maintain a positional relationship in which, on a flat plane formed by the X axis and the Y axis running at a right angle to the Z axis, a polygonal flat plane S is obtained by connecting the points P1 to P3, which mark the positions of the magnetostrictive bodies, the number sides of which corresponds to the number of bodies. In this structure, each of the magnetostrictive bodies 10 to 30 is subjected to a different enlongation/contraction effect relative to an external force applied in the direction of the X axis and the Y axis. Thus, each of the magnetostrictive bodies 10 to 30 generates a detection output with a detected voltage value or a detected phase different from the others. Consequently, based upon the detection outputs from the magnetostrictive bodies 10 to 30, an external force applied in the direction of the X axis and the Y axis can also be detected.

On the flat plane formed by the X axis and the Y axis, if the direction of an external force changes, the enlongation/contraction effect in each of the magnetostrictive bodies 10 to 30 changes in correspondence to the direction of the external force after the change. This makes it possible to detect an external force from any direction Zm around the Z axis.

Figure 2:
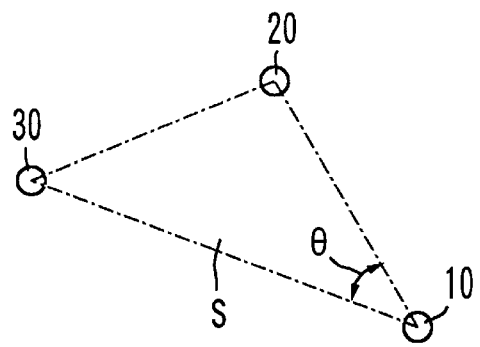
FIG. 2 is an illustration of one example of the positioning of the magnetostrictive bodies that may be adopted in the magnetostrictive device according to the present invention.

In FIG. 1, three magnetostrictive bodies, i. e., the magnetostrictive bodies 10 to 30, are provided. They maintain a positional relationship in which the flat plane S, obtained by connecting the positioning points P1 to P3, constitutes a triangular flat plane. The internal angle θ of the triangular flat plane S may be selected arbitrarily, as shown, for example, in FIG. 2. However, for purposes of manufacturing an actual product, it is desirable to set the angle at approximately 60°. This arrangement is suitable for positioning the magnetostrictive bodies 10 to 30 with good balance.

The coils 110 to 310 are wound around the magnetostrictive members 120 to 320 respectively, with the direction of their winding axes aligned with the direction of the Z axis.

The magnetostrictive members 120 to 320 may be constituted of an NiFe magnetostrictive material, an RFe magnetostrictive material or the like. It is particularly desirable to constitute them with an RFe magnetostrictive material. In that case, a sensor which demonstrates very large changes in magnetic resistance, high output voltage, stable temperature characteristics and the like can be achieved. Reference numbers 111, 112 to 311, 312 indicate lead wires of the coils 110 to 310.

Each of the magnetostrictive members 120 to 320 is constrained at the two ends in the direction of the Z axis and is under pressure. Through this pressure, pre-stresses F1 to F3 are applied to the magnetostrictive members 120 to 320. These pre-stresses F1 to F3 increase the changes in resistance at the magnetostrictive members 120 to 320, and improves the efficiency.

The magnetic circuit body 130 includes a magnet 131 and yoke members 132 and 133. The magnet 131 is provided between the first yoke member 132 and the second yoke member 133. Likewise, the magnetic circuit body 230 includes a magnet 231 and yoke members 232 and 233, with the magnet 231 provided between the first yoke member 232 and the second yoke member 233, and the magnetic circuit body 330 includes a magnet 331 and yoke members 332 and 333, with the magnet 331 provided between the first yoke member 332 and the second yoke member 333.

Figure 3:
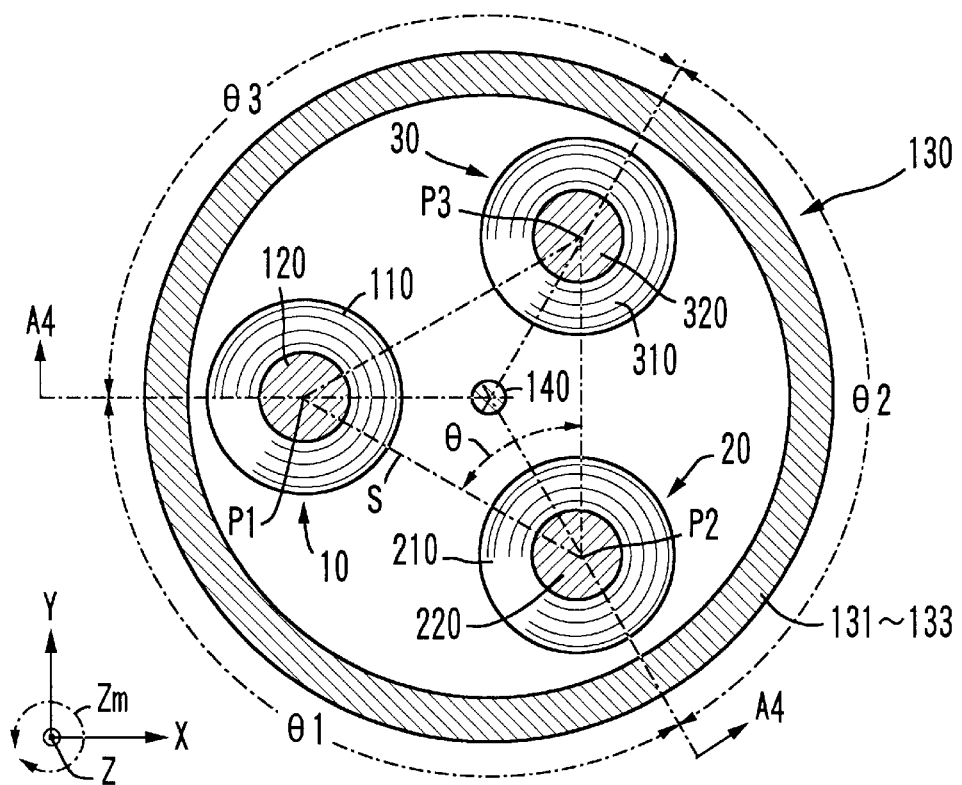
FIG. 3 is a planar cross section of a more specific embodiment of the magnetostrictive device according to the present invention.
Figure 4:
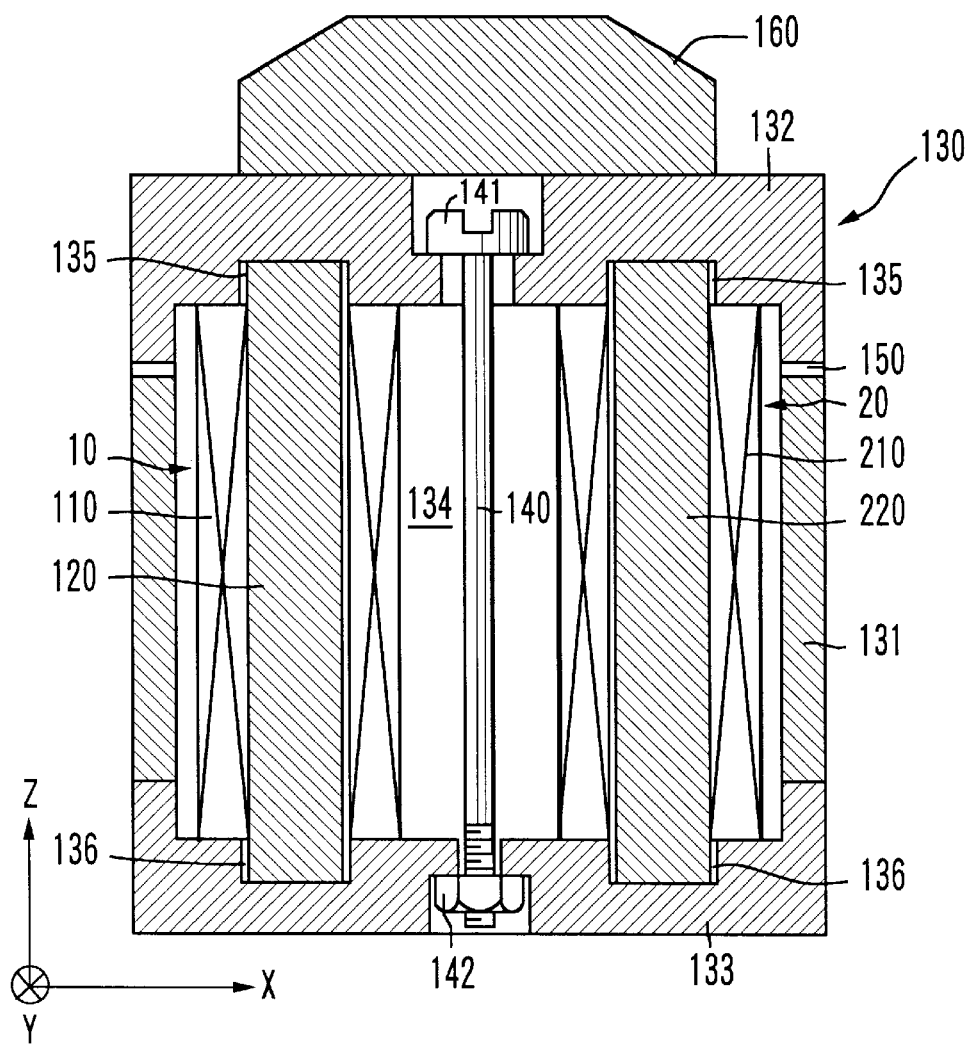
FIG. 4 is a cross section through line A4—A4 in FIG. 3.
Figure 5A:
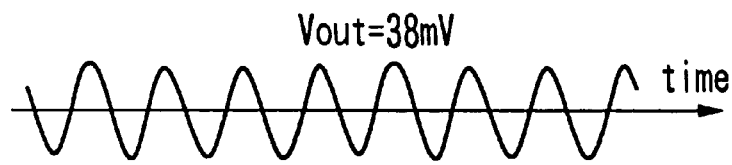
FIG. 5 shows data indicating the relationships between the waveforms of detected output voltages of the individual magnetostrictive bodies and the waveform of the applied vibration when an exciting force vibrating in the direction of the Z axis is applied.
Figure 5B:
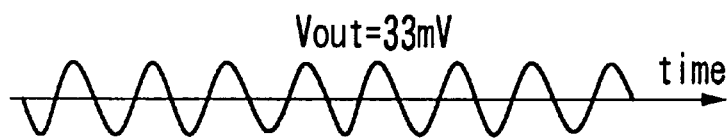
Figure 5C:
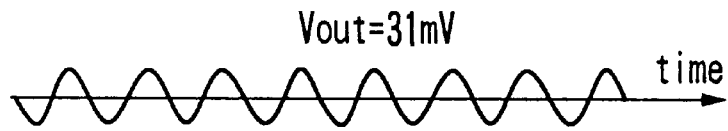
Figure 5D:
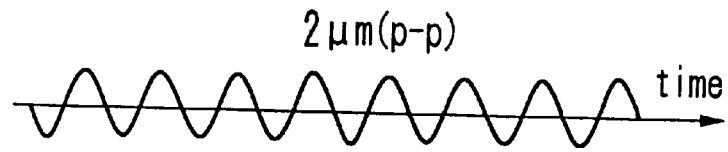
Figure 6A:
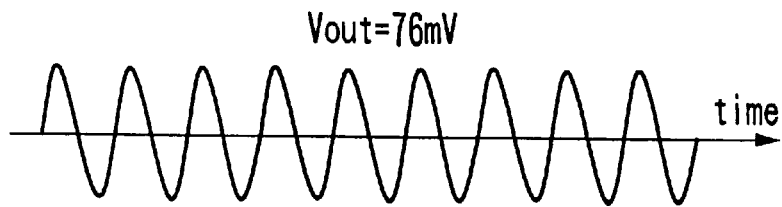
FIG. 6 shows data indicating the relationships between the waveforms of detected output voltages of the individual magnetostrictive bodies and the waveform of the applied vibration when an exciting force vibrating in the direction of the X axis is applied.
Figure 6B:
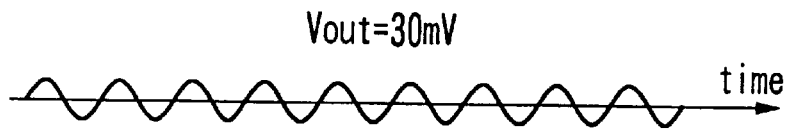
Figure 6C:
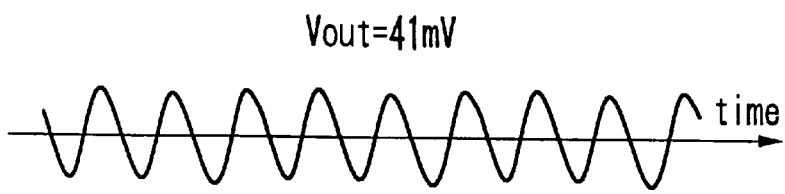
Figure 6D:
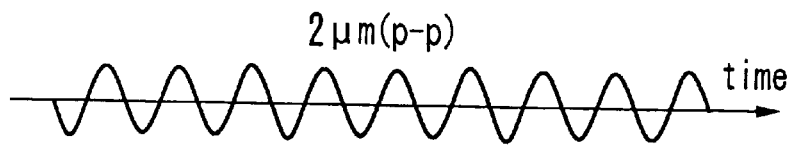
Figure 7A:
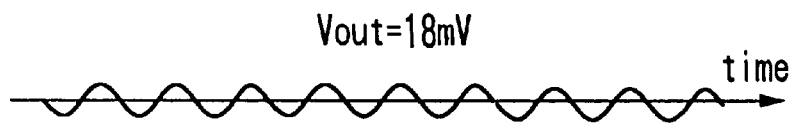
FIG. 7 shows data indicating the relationships between the waveforms of detected output voltages of the individual magnetostrictive bodies and the waveform of the applied vibration when an exciting force vibrating in the direction of the Y axis is applied.
Figure 7B:
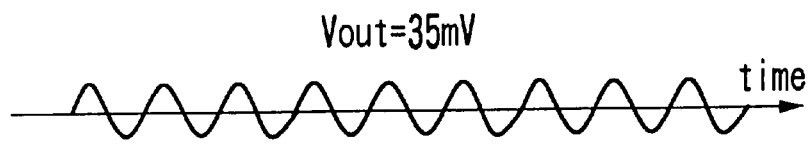
Figure 7C:
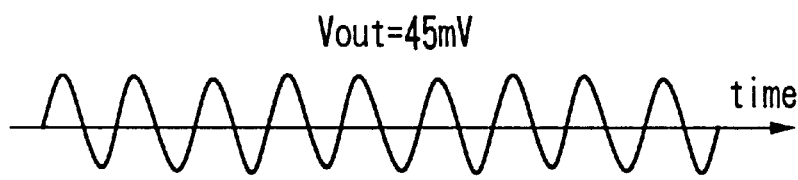
Figure 7D:
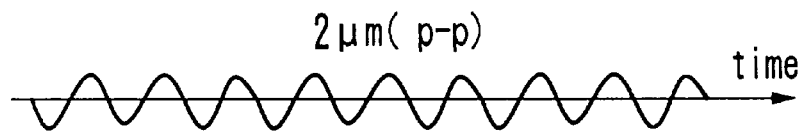

FIG. 3 is a planar cross section of a more specific embodiment of the magnetostrictive device according to the present invention, and FIG. 4 is a cross section through line A4 to A4 in FIG. 3.

In this embodiment, three magnetostrictive bodies, i.e., the magnetostrictive bodies 10, 20 and 30, are provided. The coils 110 to 310 are wound around the magnetostrictive members 120 to 320 respectively, with the direction of their winding axes matching the direction of the Z axis. Three magnetostrictive bodies, i.e., the magnetostrictive bodies 10 to 30 provided so as to maintain a positional relationship in which the flat plane S obtained by connecting the individual positioning points P1 to P3 constitutes a triangular flat plane. The internal angle θ of the triangular flat plane S is set at approximately 60°. This improves the positional balance among the magnetostrictive bodies 10 to 30. In this case, the angles separating the magnetostrictive bodies 10 to 30, i.e. the angles θ1 to θ3 are approximately 120°.

The coils 110 to 310 are wound around the magnetostrictive members 120 to 320 respectively, with the direction of their winding axes aligned with the direction of the Z axis.

A magnetic circuit body, which is shared by the magnetostrictive bodies 10, 20 and 30, is provided. This achieves a reduction in the number of components required and simplification of the structure. In FIGS. 3 and 4, reference number 130 indicates the common magnetic circuit body. The magnetic circuit body 130 includes a magnet 131, the first yoke member 132 and the second yoke member 133.

The magnet 131 is shaped cylindrically and is positioned surrounding the magnetostrictive bodies 10 to 30. The first yoke member 132 is provided toward one end of the magnet 131 in the direction of the Z axis whereas the second yoke member 133 is provided toward the other end in the direction of the Z axis. As a result, the magnet 131 is positioned between the first yoke member 132 and the second yoke member 133.

The first yoke member 132 and the second yoke member 133 are secured by a fastening member 140 which passes through a hollow portion 134 and allows pressure to be applied to the two ends of each of the magnetostrictive bodies 10 to 30 in the direction of the Z axis to achieve the required pre-stress. The fastening member 140 is constituted of a non-magnetic material. Fastening nuts 141 and 142 are linked to the two ends of the fastening member 140. One of the nuts 141 and 142 may be formed as an integrated part of the fastening member 140. This embodiment represents such a case.

With this simple structure, which requires a small number of components, it is possible to apply a consistent magnetic field to the magnetostrictive members 120 to 320 and, therefore, it is possible to operate the magnetostrictive members 120 to 320 with a high degree of efficiency. In addition, pre-stress can be applied to the magnetostrictive members 120 to 320 to increase the changes in the magnetic resistance of the magnetostrictive members 120 to 320. An increase in the change in the magnetic resistance brings about an increase in output.

The fastening member 140 may be positioned anywhere, as long as it is within the triangular flat plane S (see FIG. 3) which is obtained by connecting the positioning points P1 to P3 of the magnetostrictive bodies 10 to 30. Even more desirable, it should be positioned passing through the center of gravity of the triangular flat plane S. With such a positional arrangement employed, an averaged pre-stress can be applied to the magnetostrictive bodies 10 to 30.

In order to prevent misalignment of the magnetostrictive members 120 to 320 and also in order to simplify assembly, it is desirable to provide indented receptacle portions 135 and 136 respectively at the first yoke member 132 and the second yoke member 133, and to insert the end portions of the magnetostrictive members 120 to 320 inside these indented receptacle portions 135 and 136.

During assembly, it should be assured that an air gap 150 is formed between the magnet 131 and the first yoke member 132 or between the magnet 131 and the second yoke member 133 when the two ends each of the magnetostrictive members 120 to 320 are fastened with the first yoke member 132, the second yoke member 133 the fastening member 140 and the nuts 141 and 142, in order to tolerate enlongation/contraction of the magnetostrictive members 120 to 320 in the direction of the Z axis.

The magnetostrictive device shown in FIGS. 3 and 4 is further provided with a mass body 160 above the first yoke member 132. This indicates that the magnetostrictive device in the figures is employed as an acceleration sensor or a vibration sensor.

The qualitative effects of the magnetostrictive device described above are essentially identical to the effects and advantages explained in reference to FIG. 1. They are more specifically explained below, in reference to the data shown in FIGS. 5 to 7.

FIG. 5 presents data that indicate the relationships between waveforms (a) to (c) of the detected output voltages at the individual magnetostrictive bodies and the waveform (d) of the applied vibration when an exciting force vibrating in the direction of the Z axis is applied. In FIGS. 5 to 7, the applied vibration has a vibration frequency of 1 kHz, an acceleration of 1 G and a vibration amplitude of 2 $\mu$m (p–p value).

As shown in FIG. 5, the magnetostrictive bodies 10 to 30 all generate relatively averaged output voltages ranging between 31 mV and 38 mV in correspondence to an external force applied in the direction of the Z axis.

FIG. 6 presents data that indicate the relationships between the waveforms (a) to (c) of the detected output voltages at the individual magnetostrictive bodies and the waveform (d) of the applied vibration when an exciting force is applied in the direction of the X axis. The direction of the X axis is taken in the direction passing through the centers of the magnetostrictive body 10 and the fastening member 140.

As shown in FIG. 6, each of the magnetostrictive bodies 10 to 30 is subjected to a different enlongation/contraction effect relative to an external force applied in the direction of the X axis. Because of this, a detection output is generated at each of the magnetostrictive bodies 10 to 30 with a detection voltage value and a detection phase that is different from the others. In the case illustrated in FIG. 6, the vibration in the direction of the X axis generates an output voltage of 76 mV at the magnetostrictive body 10 that expands or contracts to a great degree, whereas low output voltages of only 30 mV and 41 mV are generated at the magnetostrictive body 20 and the magnetostrictive body 30 respectively. Consequently, based upon the detection output from the magnetostrictive bodies 10 to 30 and also based upon their phase differences, it is possible to detect an external force applied in the direction of the X axis. Although, in theory, the output voltages from the magnetostrictive bodies 20 and 30 must be at the same value, due to such factors as assembly conditions and the like, in fact, they demonstrate different values, as mentioned earlier. The output voltage values may be corrected using, for instance, an equalizer.

FIG. 7 presents data that indicate the relationships between the waveforms (a) to (c) of the detected output voltages of the magnetostrictive bodies and the waveform (d) of the applied vibration when an exciting force vibrating in the direction of the Y axis is applied. The direction of the Y axis is the direction that runs at a right angle to the direction of the X axis in FIG. 6.

In the case illustrated in FIG. 7, the vibration in the direction of the Y axis causes the magnetostrictive bodies 20 and 30 to enlongate/contract to a greater degree than the magnetostrictive body 10. Whereas the magnetostrictive bodies 20 and 30 generate output voltages of 35 mV and 45 mV respectively, the magnetostrictive body 10 only generates a low output voltage of 18 mV. Consequently, based upon the detection outputs of the magnetostrictive bodies 10 to 30 and their phase differences, it is also possible to detect an external force applied in the direction of the Y axis.

When the present invention is to be employed as a torque sensor, the mass body 160 in FIG. 4 is removed and the first yoke member 132 is linked to a moving body whose torque is to be detected. The second yoke member 133 side is fixed. The detection signals corresponding to the rotational torque around the Z axis can be obtained from the individual magnetostrictive bodies 10 to 30.

When the present invention is to be adopted as an actuator, a motor or the like, power that is controlled to cause each of the magnetostrictive bodies 10 to 30 to enlongate/contract sequentially in the direction of the Z axis, i.e., power that is phase controlled, for instance, is supplied to each of the magnetostrictive bodies 10 to 30. This achieves a displacement to be used by the actuator or the motor at at least one end surface in the direction of the Z axis. For instance, by using a plane of the first yoke member 132 as a displacement plane and securing the second yoke member 133, the displacement generated on the plane of the first yoke member 132 can be utilized as displacement for the actuator or the motor.

Figure 8:
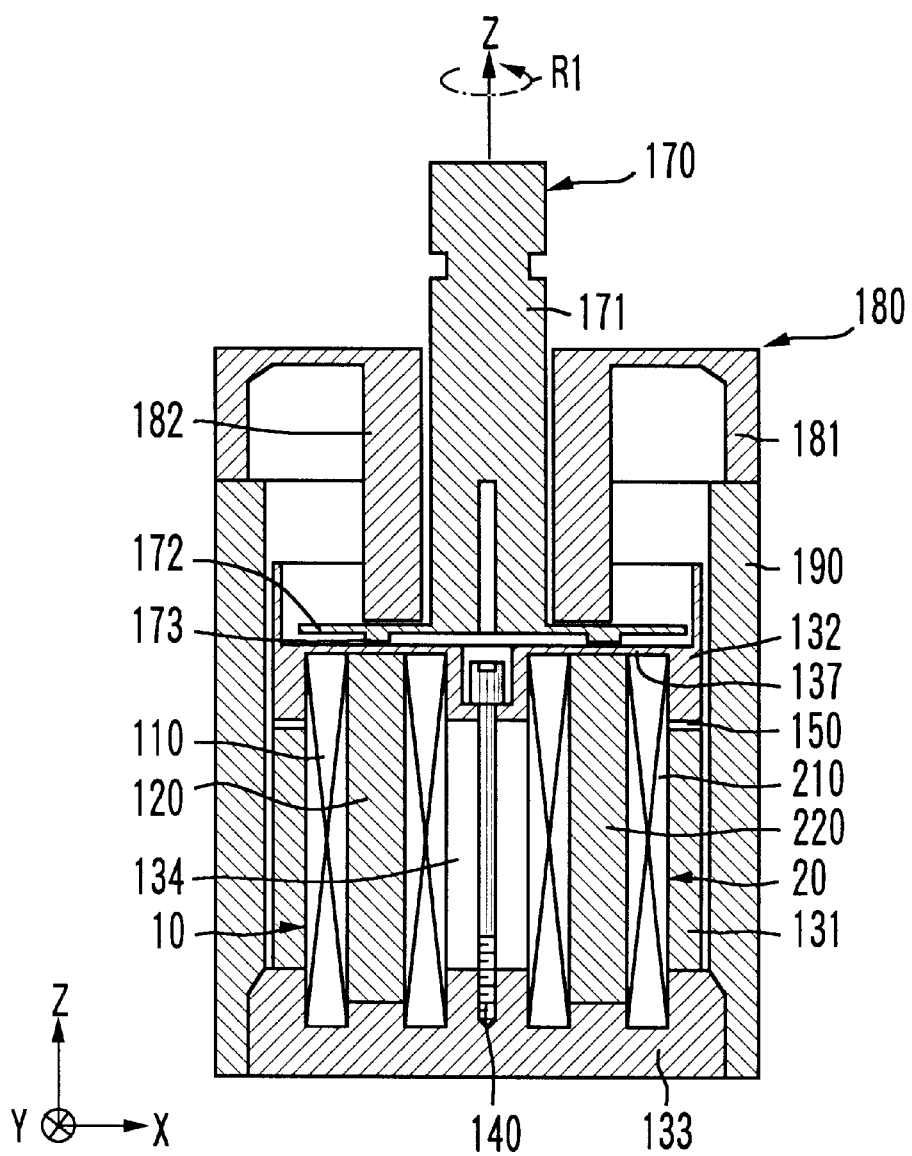
FIG. 8 is a cross section of an example of the magnetostrictive device according to the present invention, which is employed as a motor.

FIG. 8 shows an example of the magnetostrictive device according to the present invention which is used as a motor. In the figure, components identical to those in FIG. 4 are assigned with the same reference numbers. In FIG. 8, the magnetostrictive device is provided with a rotor 170. The rotor 170 is provided with a rotating shaft 171. One end of the rotating shaft 171 is led out to the outside of a housing member 180. At the other end of the rotating shaft 171, a disk portion 172 is provided as an integrated part, with projections 173 provided on one plane of the disk portion 172. These projections 173 are provided at positions that correspond to the positions of the magnetostrictive bodies 10 to 30. The projections 173 may be formed in a continuous ring shape or they may be formed over intervals in a circle.

The first yoke member 132 is provided with a thin plate-like displacement portion 137 at a position facing opposite the disk portion 172 of the rotor 170. This displacement portion 137 becomes displaced by the displacement occurring at the magnetostrictive bodies 10 to 30.

The housing member 180 is provided with an inner cylindrical portion 182, into which the rotating shaft 171 of the rotor 170 are inserted. There is a gap between the front end portion of the inner cylindrical portion 182 and the disk portion 172 of the rotor 170, which allows the rotation of the rotor 170 and also restricts reciprocation of the rotor 170 in the direction of the Z axis.

An outer cylindrical portion 181 of the housing member 180 is linked with a housing member 190 by means such as screwing, bonding or the like. The housing member 190 covers the essential portion of the magnetostrictive device, with its lower end portion linked to the second yoke member 133 by means such as screwing, press-fitting, bonding or the like.

The magnetostrictive device described above operates as a plane wave rotary motor. The operating principle of a plane wave rotary motor is as follows. Generally speaking, when a vibration at A cos $\omega$t is applied to an excitation source at one point $\theta$=0 on a toroid, the distribution of the nth vibration standing wave is expressed as:

$$y = A \cos n\theta \cdot \cos \omega t \quad (1)$$

The progressive wave, which is communicated in the positive direction of theta at this time, is expressed as:

$$y = A \cos(\omega t - n\theta) \quad (2)$$

and thus, the term for the angles and the term for the time are incorporated with each other. Formula (2) is expressed as:

$$y = A \cos n\theta \cdot \cos \omega t + A \cos(n\theta - \pi/2) \cdot \cos(\omega t - \pi/2)$$

and this makes it possible to regard it as the sum of two standing waves. In other words, by shifting the phases in time and the phases in space of two sources of excitation by $\pi/2$ each, a progressive wave is achieved. Normally, the phase difference may be selected arbitrarily except for zero and $\pm\pi$. In this case, a rotating drive force in the direction opposite from the traveling direction of the progressive wave can be achieved.

In order to utilize the operating principle described above in the magnetostrictive device shown in FIG. 8, the three magnetostrictive bodies 10 to 30, which constitute sources of excitation, are positioned at 120° angles from each other, dividing a circumference into three almost equal portions. The magnetostrictive bodies 10 to 30 are then driven by a three-phase input voltage with the phase difference at 120°. For instance, using the magnetostrictive body 10 for reference, an input voltage with a phase difference of 120° is supplied to the magnetostrictive body 20 and an input voltage with a phase difference of 240° is supplied to the magnetostrictive body 30. The progressive wave generated at this time causes the rotor 170 to rotate in the direction opposite from the traveling direction of the progressive wave, i.e., in the direction indicated with the arrow R1, for instance. By changing the way in which the phase differences of the three-phase input voltage for the magnetostrictive bodies 10 to 30 are set and by reversing the traveling direction of the progressive wave, the direction of rotation can be reversed.

Figure 9:
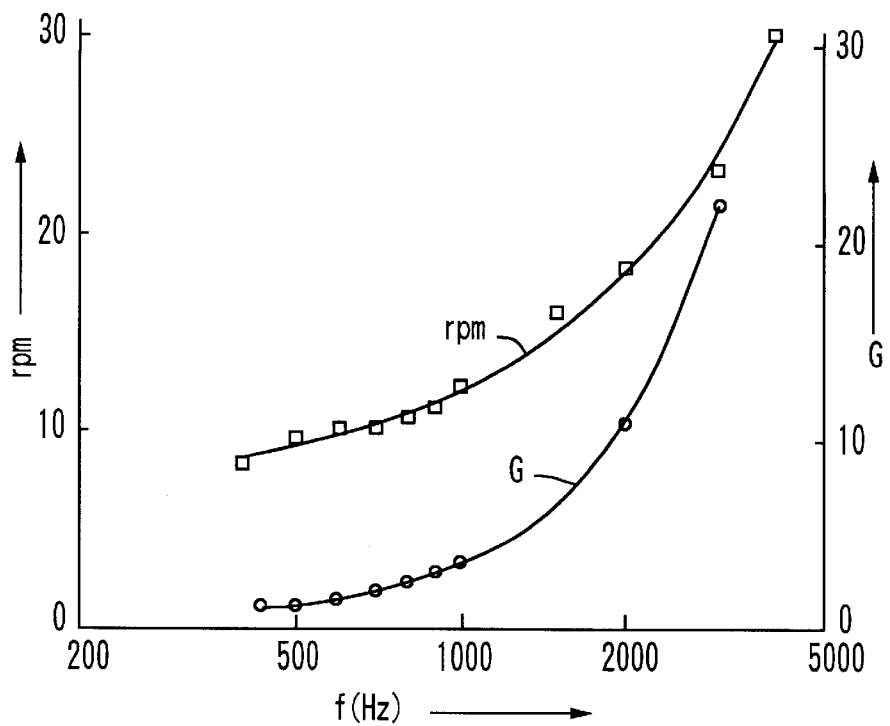
FIG. 9 is a graph showing the relationship between the drive frequency and the rotation rate (rpm) and the frequency and the acceleration (G) in the magnetostrictive device shown in FIG. 8.

FIG. 9 shows the relationship between the drive frequency and the rotation rate (rpm) and the relationship between the frequency and the acceleration (G). As the frequency goes up, the rotation rate (rpm) also increases and, at the same time, the acceleration (G) increases.

Figure 10:
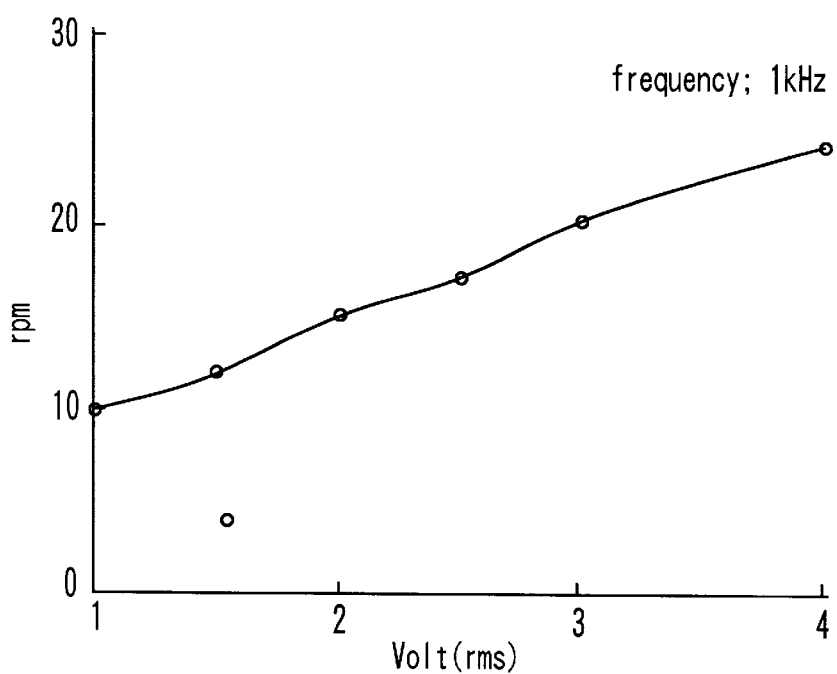
FIG. 10 is a graph showing the relationship between the drive voltage and the rotation rate in the magnetostrictive device shown in FIG. 8.

FIG. 10 shows the relationship between the drive voltage and the rotation rate (rpm). As shown in the figure, when the drive voltage increases, the rotation (rpm) also increases almost linearly. This is assumed to be attributable to an increase in the drive voltage resulting in an increase in the current value of the electric currents running through the coils 110 to 310, which, in turn, increases the quantity of displacement at the magnetostrictive bodies 10 to 30.

As explanation has been given of the present invention by referring to preferred embodiments, it is obvious to persons skilled in the art that, based upon the essential technical concept and scope of the present invention, a number of variations may be achieved.

What is claimed is:

1. A magnetostrictive device comprising:
   at least three magnetostrictive bodies each including a magnetostrictive member constrained at two ends thereof and at least one coil wound around said magnetostrictive member so that a voltage corresponding to an elongation/contraction of said magnetostrictive member is generated; and
   at least one magnetic circuit having a magnet, a first yoke member and a second yoke member, said magnetic circuit applying a bias magnetic field to said magnetostrictive member;
   said magnetostrictive bodies positioned so as to be aligned in the direction of a Z axis that is taken in the direction of said two ends of said magnetostrictive member and, on a flat plane formed by a X axis and a Y axis running at a right angle to the direction of said Z axis, a polygonal flat plane is constituted by connecting points at which said magnetostrictive bodies are positioned, the number of sides thereof corresponding to the number of said magnetostrictive bodies.

2. A magnetostrictive device according to claim 1, wherein:
   the number of said magnetostrictive bodies is 3.

3. A magnetostrictive device according to claim 1, wherein:
   said coil is wound around said magnetostrictive member to form a winding with the direction of an axis of said winding aligned with the direction of said Z axis.

4. A magnetostictive device according to claim 1, further comprising a fastening member which applies a pre-stress to said magnetostrictive members in the direction of said Z axis.

5. A magnetostrictive device according to claim 1, wherein:
   said first yoke member being positioned toward one end in the direction of said Z axis and said second yoke member being positioned toward another end in the direction of said Z axis, and;
   said magnet is positioned between said first yoke member and said second yoke member.

6. A magnetostrictive device according to any of claims 1 through 5 employed as a vibration sensor.

7. A magnetostrictive device according to any of claims 1 through 5 employed as an acceleration sensor.

8. A magnetostrictive device according to any of claims 1 through 5 employed as an actuator.

9. A magnetostrictive device according to any of claims 1 through 5 employed as a torque sensor.

10. A magnetostrictive device comprising:
    at least three magnetostrictive bodies each including a magnetostrictive member constrained at two ends thereof and at least one coil wound around said magnetostrictive member so that an elongation/contraction of said magnetostrictive member is generated when a voltage is applied to said coil;
    a rotor having a rotary shaft with one end coupled to said magnetostrictive bodies such that displacements of said magnetostrictive members in the direction of a Z axis produce rotation of said rotary shaft; and
    at least one magnetic circuit applying a bias magnetic field to said magnetostrictive member;
    said magnetostrictive bodies positioned so as to be aligned in the direction of said Z axis that is taken in the direction of said two ends of said magnetostrictive member and, on a flat plane formed by a X axis and a Y axis running at a right angle to the direction of said Z axis, a polygonal flat plane is constituted by connecting points at which said magnetostrictive bodies are positioned, the number of sides thereof corresponding to the number of said magnetostrictive bodies;
    said magnetostrictive device is employed as a motor.

11. A magnetostrictive device according to claim 10, wherein:
    the number of said magnetostrictive bodies is 3.

12. A magnetostrictive device according to claim 11, wherein:
    said magnetostrictive bodies are positioned approximately on one circumference at an angle of approximately 120° to one another.

13. A magnetostrictive device according to claim 12, wherein:

said coil is individually wound around said magnetostrictive member provided in each of said magnetostrictive bodies, with the direction of an axis of said winding aligned with the direction of said Z axis.

14. A magnetostrictive device according to claim 13, wherein:

said coil is excited by a 3-phase drive source having a 120° phase difference.

15. A magnetostictive device according to claim 14, further comprising a fastening member which applies a pre-stress to said magnetostrictive member in the direction of said Z axis.

16. A magnetostrictive device according to claim 14, wherein:

said magnetic circuit is provided with a magnet and a yoke;

said yoke includes a first yoke member and a second yoke member, with said first yoke member being positioned toward one end in the direction of said Z axis and said second yoke member being positioned toward another end in the direction of said Z axis, and;

said magnet is positioned between said first yoke member and said second yoke member.

17. A magnetostrictive device according to claim 16, wherein:

said first yoke member is provided with a displacement portion that becomes displaced in correspondence to displacement occurring at one end surface in the direction of said Z axis of said magnetostrictive bodies, and;

said rotor is driven by a progressive wave generated at said displacement portion.

18. A magnetostrictive device according to claim 17, wherein:

said first yoke member and said second yoke member are fastened to each other with a fastening member thereby applying a pre-stress to said magnetostrictive member in the direction of said Z axis.

19. A magnetostrictive device according to claim 10, wherein said one end of said rotary shaft further comprises:

a disk portion having projections provided at positions that correspond to said magnetostrictive bodies.

20. A magnetostrictive device comprising;

at least three magnetostrictive bodies each including a magnetostrictive member constrained at two ends thereof and at least one coil wound around said magnetostrictive member so that a voltage corresponding to an elongation/contraction of said magnetostrictive member is generated; and at least one magnetic circuit applying a bias magnetic field to said magnetostrictive member;

said magnetic circuit being provided with a magnet, a first yoke member and a second yoke member, said first yoke member being positioned toward one end in the direction of said Z axis and said second yoke member being positioned toward another end in the direction of said Z axis, and said magnet being positioned between said first yoke member and said second yoke member;

said magnetostrictive bodies positioned so as to be aligned in the direction of a Z axis that is taken in the direction of said two ends of said magnetostrictive member and, on a flat plane formed by a X axis and a Y axis running at a right angle to the direction of said Z axis, a polygonal flat plane is constituted by connecting points at which said magnetostrictive bodies are positioned, the number of sides thereof corresponding to the number of said magnetostrictive bodies.

21. A magnetostrictive device according to claim 20, wherein:

said first yoke member and said second yoke member are fastened to each other with a fastening member, thereby applying a pre-stress to said magnetostrictive member in the direction of said Z axis.

22. A magnetostrictive device comprising:

at least three magnetostrictive bodies each including a magnetostrictive member constrained at two ends thereof and at least one coil wound around said magnetostrictive member so that an elongation/contraction of said magnetostrictive member is generated when a voltage is applied to said coil; and at least one magnetic circuit applying a bias magnetic field to said magnetostrictive member;

said magnetic circuit being provided with a magnet, a first yoke member and a second yoke member, said first yoke member being positioned toward one end in the direction of said Z axis and said second yoke member being positioned toward another end in the direction of said Z axis, and said magnet being positioned between said first yoke member and said second yoke member;

said magnetostrictive bodies positioned so as to be aligned in the direction of a Z axis that is taken in the direction of said two ends of said magnetostrictive member and, on a flat plane formed by an X axis and a Y axis running at a right angle to the direction of said Z axis, a polygonal flat plane is constituted by connecting points at which said magnetostrictive bodies are positioned, the number of sides thereof corresponding to the number of said magnetostrictive bodies.

* * * * *